United States Patent
Inagaki et al.

(10) Patent No.: US 7,462,994 B2
(45) Date of Patent: Dec. 9, 2008

(54) LED ILLUMINATION APPARATUS

(75) Inventors: Satoshi Inagaki, Aichi (JP); Mitsuhiro Nawashiro, Aichi (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 155 days.

(21) Appl. No.: 11/237,910

(22) Filed: Sep. 29, 2005

(65) Prior Publication Data

US 2006/0076905 A1   Apr. 13, 2006

(30) Foreign Application Priority Data

Sep. 30, 2004   (JP)   ............................. P2004-285806

(51) Int. Cl.
   *G05F 1/00*   (2006.01)
   *F21V 7/04*   (2006.01)

(52) U.S. Cl. ...................... 315/291; 362/800

(58) Field of Classification Search ................ 315/176, 315/179, 80, 76–77, 78, 291, 312, 185 S; 362/800, 217, 249–252, 459, 485, 487, 84

See application file for complete search history.

(56) References Cited

U.S. PATENT DOCUMENTS

| | | | | |
|---|---|---|---|---|
| 5,634,711 | A * | 6/1997 | Kennedy et al. | 362/119 |
| 5,883,428 | A * | 3/1999 | Kabumoto et al. | 257/691 |
| 5,933,441 | A * | 8/1999 | Chen | 372/38.09 |
| 6,550,953 | B1 * | 4/2003 | Ichikawa et al. | 315/56 |
| 6,600,274 | B1 * | 7/2003 | Hughes | 315/291 |
| 6,636,003 | B2 * | 10/2003 | Rahm et al. | 315/179 |
| 6,797,987 | B2 * | 9/2004 | Chen | 257/98 |
| 2003/0087843 | A1 * | 5/2003 | Washburn | 514/43 |
| 2006/0087843 | A1 * | 4/2006 | Setomoto et al. | 362/249 |

* cited by examiner

*Primary Examiner*—Douglas W. Owens
*Assistant Examiner*—Minh Dieu A
(74) *Attorney, Agent, or Firm*—McGinn IP Law Group, PLLC

(57) ABSTRACT

An LED illumination apparatus comprising a radiative substrate, at least one LED provided on the radiative substrate and a constant current circuit connected to the LED is provided.

26 Claims, 3 Drawing Sheets

LED ILLUMINATION APPARATUS

This application is based on Japanese Patent application No. 2004-285806, which is incorporated herein by reference.

BACKGROUND OF THE INVENTION

1. Field of the Invention

The invention relates to an LED illumination apparatus, particularly, improvement of an LED illumination apparatus used in a vehicle.

2. Description of the Related Art

An LED is being used as a light source for indoor illumination in a vehicle by virtue of advantages such as high brightness and a long life. As a power supply in such illumination, used is a vehicle battery. The battery is also used as a power supply to another electric driving system (a wiper, a power window, an electrically sliding door, a winker, a headlight and such) in the vehicle. Recently, the vehicle battery has been also used as a power supply for electric power steering or electric driving in a hybrid vehicle.

A supply voltage from the vehicle battery to an illumination apparatus varies in accordance with an operation of an electric driving system. Especially electric power steering and electric driving in a hybrid give a load on the vehicle battery, and thereby, cause variation in battery voltage more than the variation occurring heretofore. Using the vehicle battery as a power supply for an LED under such a condition causes a change in amount of current flowing to the LED, so that the brightness is changed. Further, the LED per se is likely to be damaged due to overheat in the case that unnecessary current flows. That is to say, variation in battery voltage causes a flicker of light emitted from the LED while overvoltage on the LED causes influence upon the LED per se.

Meanwhile, heat generated by a device other than the LED is also likely to cause damage to the LED.

SUMMARY OF THE INVENTION

Accordingly, an object of the invention is to provide a structure of the apparatus, which is capable of stabilizing a supply current to an LED and stably driving the LED. Another object of the invention is to provide a structure of the apparatus, which causes less influence of heat upon an LED and which is superior in reliability and stability.

The invention includes the following structure in order to achieve at least one of the above objects. That is to say, an apparatus in accordance with the invention is an illumination apparatus comprising a radiative substrate, at least one LED provided on the radiative substrate, and a constant current circuit connected to the LED.

In accordance with the structure, a current of a constant value flows to an LED via a constant current circuit. That is to say, a current flowing to the LED can be kept at a constant value by means of a constant current circuit even when a battery voltage varies. This allows the LED to emit light with constant brightness. In addition, damage caused by heat of the LED per se due to increase in current can be prevented, so that the life of the LED device can be elongated.

BRIEF DESCRIPTION OF THE DRAWINGS

FIG. 1 shows an LED illumination apparatus.

DETAILED DESCRIPTION OF THE PREFERRED EMBODIMENTS

Figure 1A:
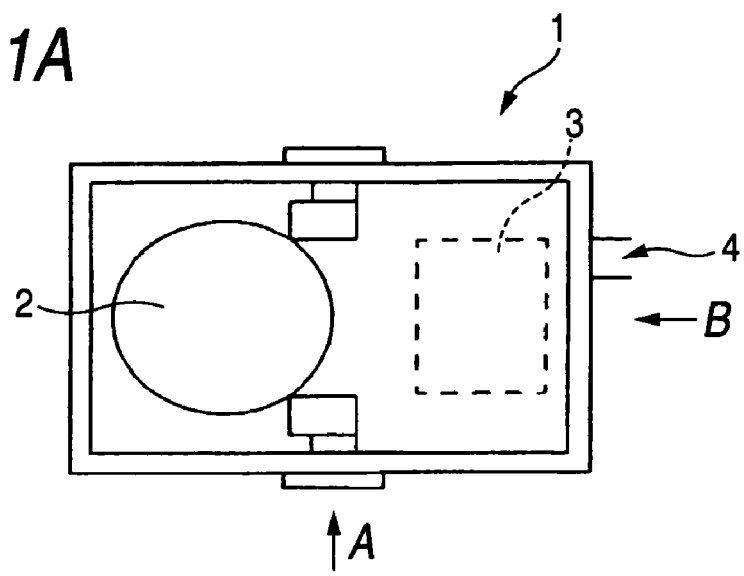
FIG. 1A is a top view of the LED illumination apparatus.

Components of the LED illumination apparatus in accordance with the invention will be described in detail hereinafter.

(Radiative Substrate)

A radiative substrate enables heat of a circuit device provided on the radiative substrate to be efficiently radiated outside. A material of the radiative substrate is preferably superior in heat-conductivity. The radiative substrate is formed from aluminum, ceramics, copper or iron, for example. The radiative substrate is not specifically limited in shape.

It is preferable to use a heat sink together for the purpose of further efficient radiation of heat. Aluminum, ceramics, copper, and resin with high heat-conductivity for example, can be used as a heat sink. The heat sink is not specifically limited in shape. The heat sink has preferably a shape in which a plurality of radiation fins 6a are provided to widen the surface area of a heat sinking area as shown in FIG. 1B, for example. The radiative substrate may be integrally formed with the heat sink.

(LED)

An LED is used as a light source in the invention. A device of a bullet type, which includes a lens as sealing resin, or a SMD type (a surface mounted device type), for example, is used although the LED is not specifically limited in kind. The color of light emitted from the LED is also not limited specifically. A white LED can be used, for example.

An operation voltage of an LED generally used at present (a white LED, for example) is about 3 V to 4 V. In the case of using a vehicle battery of 12 volts as a power supply for an LED, about 10 V to 16 V can be secured as a driving voltage for the LED. In view of the above, the number of the LED connected to an LED illumination apparatus is preferably 1 to 3. More favorably, two LEDs may be connected.

(Constant Current Circuit)

A constant current circuit is used for fixedly controlling a current flowing to the LED. Circuitry of the constant current circuit, a device used in the constant current circuit and such are not limited. When an LED illumination apparatus is installed in a limited space in a vehicle or such, the constant current circuit must be reduced in size and devices forming the constant current circuit are required to be arranged in a relatively small area. Accordingly, the number of the devices for forming the constant current circuit is preferably decreased as much as possible. This is because reduction in number of the devices increases a degree of free in arrangement, so that a device with a large heat value can be easily provided away from the LED. Further, fewer devices allow a heat value of a whole constant current circuit to be reduced, so that heat influences little upon the LED.

In the case of using a transistor, a resistor, a Zener diode, a diode and the like as circuit devices forming the constant current circuit, for example, the transistor has the largest heat value. In the case that the LED and the constant current circuit are provided on a same substrate, the LED is preferably provided away from a transistor as much as possible so that the LED would be hardly influenced by heat of the transistor.

Figure 2A:
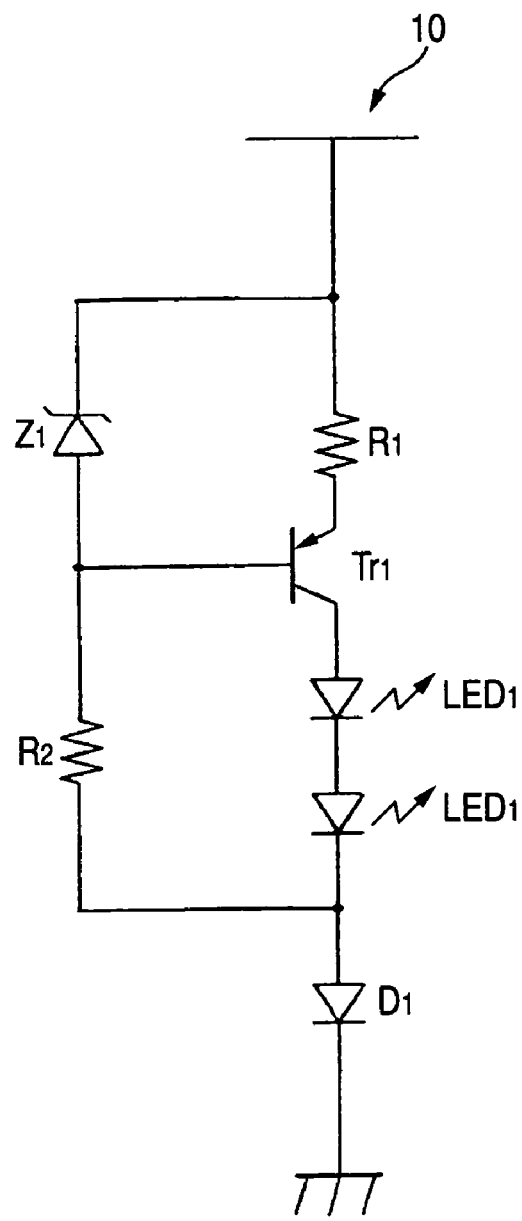
FIG. 2 shows a circuitry of a constant current circuit used in the LED illumination apparatus.
Figure 2B:
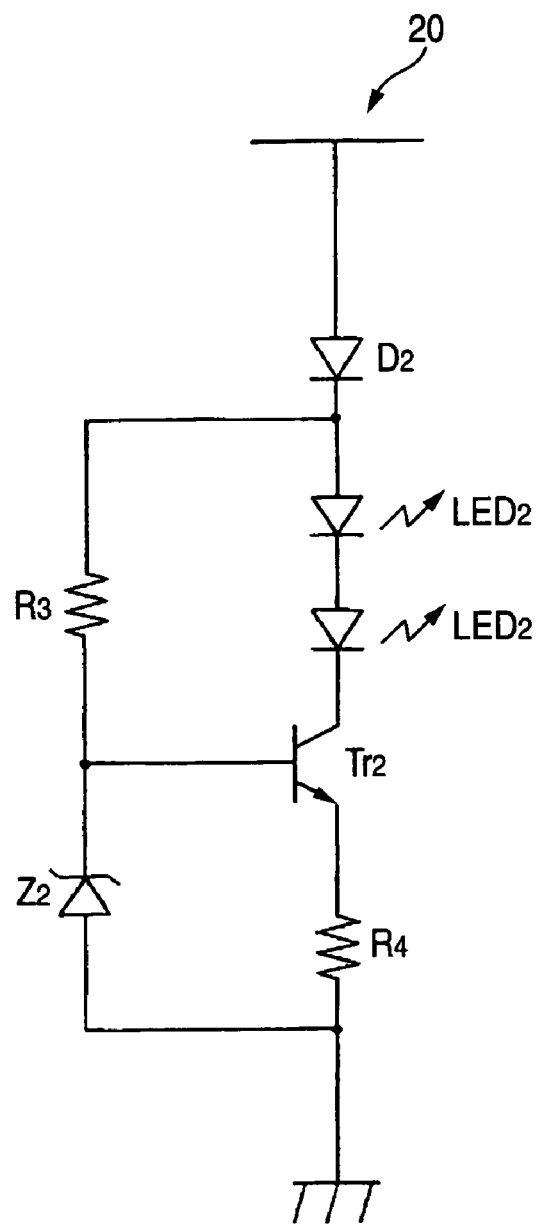

FIG. 2 shows an example of a constant current circuit used in the invention. FIG. 2A shows a circuitry in the case that the constant current circuit is controlled on a minus side. FIG. 2B shows a circuitry in the case that the constant current circuit is controlled on a plus side.

EMBODIMENTS

Figure 1B:
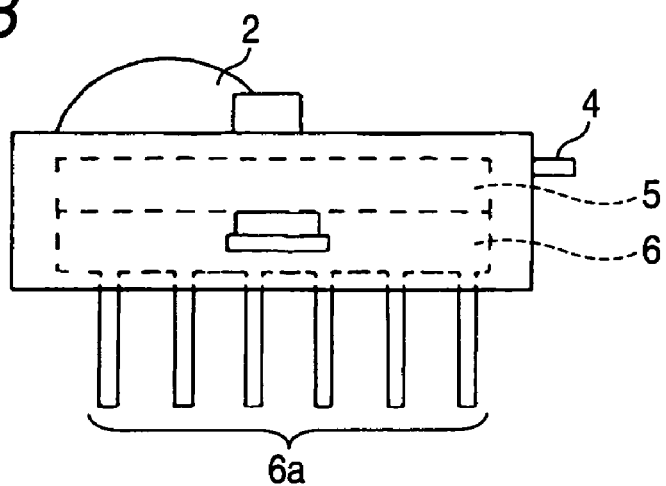
FIG. 1B is a side view of the LED illumination apparatus in a direction A.
Figure 1C:
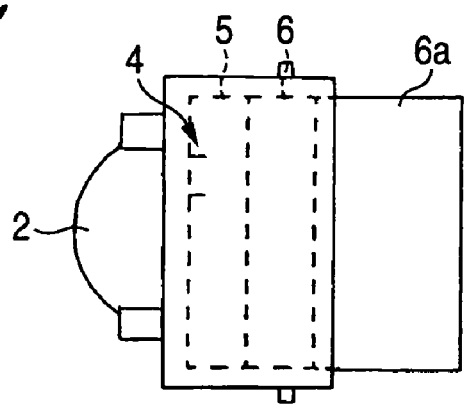
FIG. 1C is a side view of the LED illumination apparatus in a direction B.

FIG. 1 shows an LED illumination apparatus 1 as an embodiment of the invention. The LED illumination apparatus is used in a room of a vehicle. FIG. 1A is a top view of the LED illumination apparatus while FIGS. 1B and 1C are respectively a side view from a side A of FIG. 1A and a side view from a side B of FIG. 1A. In the LED illumination apparatus 1, a constant current circuit 3 and a lens 2 are provided above a radiative substrate 5 and a heat sink 6 is provided under the radiative substrate 5.

The radiative substrate 5 is used for efficiently radiating heat generated from circuit devices forming a constant current circuit. The radiative substrate 5 is formed from a material superior in heat-conductivity such as aluminum and ceramics.

The heat sink 6 is used for efficiently radiating heat conducted from the circuit devices to the radiative substrate. In the embodiment, aluminum or ceramics, which is superior in heat-conductivity, is used as a material of the heat sink 6. The heat sink 6 has a shape such that several fins 6a are provided to widen the area contacting with air for the purpose of improving a heat sinking effect.

The constant current circuit has a structure shown in FIG. 2A. The constant current circuit is connected to a control switch and a vehicle battery through a connecting terminal 4. A constant current circuit 10 comprises a resistor $R_1$, a resistor $R_2$, a Zener diode $Z_1$, a PNP type transistor $Tr_1$ and a diode $D_1$ and is connected to two $LED_1$ devices. The two $LED_1$ devices are packaged as an SMD type (a surface mounted device type) LED 32.

The lens 2 is used for converging or diffusing light emitted from the LED 32. As a material of the lens 2, used is synthetic resin such as polycarbonate, acrylic resin and epoxy resin or an inorganic material such as glass. The lens 2 has a shape suitable for converging or diffusing light from the LED 32 device on a predetermined illumination area.

In the constant current circuit 10 shown in FIG. 2A, the resistor $R_1$ and the Zener diode $Z_1$ are connected in parallel with respect to a battery voltage. The Zener diode $Z_1$ is connected so that a reverse voltage would be applied with respect to the battery voltage. The Zener diode $Z_1$ becomes conductive by applying a voltage value same as or more than that of a breakdown voltage. The other end of the transistor $R_1$ is connected to an emitter side of the transistor $Tr_1$. On the other hand, the other end of the Zener diode $Z_1$ is connected to a base side of the transistor $Tr_1$ and the resistor $R_2$. Two $LED_1$ devices are connected to a collector side of the transistor $Tr_1$ so as to apply a forward direction voltage with respect to the battery voltage. Further, the resistor $R_2$ and the $LED_1$ device are connected and the diode $D_1$ is connected between the connection point of the above and the ground so that the forward direction voltage would be applied with respect to the battery voltage.

In a constant current circuit having such a structure, the Zener diode $Z_1$ is conductive when the battery voltage exceeds the breakdown voltage $V_Z$ of the Zener diode $Z_1$. That is to say, the forward direction voltage is applied between the emitter and the base of the transistor $Tr_1$, so that the transistor $Tr_1$ turns on, and thereby, a current flows between the emitter and the collector. In this case, a current $I_{LED}$ flowing to the $LED_1$ device is expressed by the following formula:

$$I_{LED}=(V_Z-V_{BE})/R \qquad \text{(Formula 1)}$$

Wherein $V_Z$ is the breakdown voltage of the Zener diode $Z_1$, $V_{BE}$ is a base to emitter voltage of the transistor $Tr_1$ and R is a resistance value of the resistor $R_1$.

As shown in Formula 1, when a voltage applied to the Zener diode $Z_1$ can be kept at a voltage value more than that of the breakdown voltage $V_Z$, a voltage between terminals of the Zener diode $Z_1$ can be maintained at a predetermined breakdown voltage $V_Z$. Accordingly, adjusting the resistance value of the resistor R allows the current $I_{LED}$ flowing to the $LED_1$ device to be adjusted. On the other hand, when a voltage lower than the breakdown voltage is applied, the Zener diode $Z_1$ is not conductive and the transistor $Tr_1$ is off, so that no current flows between the emitter and the collector. Thus, the current $I_{LED}$ does not flow to the $LED_1$ device, and thereby, the $LED_1$ device emits no light. That is to say, in the case that a range of variation of the battery voltage is always the breakdown voltage $V_Z$ of the Zener diode $Z_1$ or more, a constant current $I_{LED}$ can be applied to the $LED_1$ device.

A resistor $R_2$ is provided so that a Zener current same as or more than a predetermined current value would flow in order to stabilize the breakdown voltage. The diode $D_1$ blocks a flow of an abnormal current from a ground side to a vehicle battery side, the flow occurring in the case that a motor load is locked, for example.

In the embodiment, used are two $LED_1$ devices connected in series. This is for the purpose of operating the $LED_1$ devices within an operational voltage thereof with respect to a voltage applied between an anode and a cathode. In the case of using a battery voltage of 12V as a supply voltage, for example, a voltage applied between a collector of the transistor $Tr_1$ and an anode of the diode $D_1$ is about 8 V. On the other hand, an operational voltage of the $LED_1$ device used in the embodiment is about 3.5 V. That is to say, providing one $LED_1$ device causes a high voltage to be applied to the transistor $Tr_1$ while providing three $LED_1$ devices causes a voltage per an $LED_1$ device to be low, so that sufficient emission of light cannot be obtained. A voltage applied to an $LED_1$ device can be an operational voltage when two $LED_1$ devices are connected.

As described above, a constant current circuit having the above-mentioned structure allows the current $I_{LED}$ flowing in the $LED_1$ device to be kept at a constant value, so that stable emission of light of the $LED_1$ device can be maintained without any influence of variation of a battery voltage.

Figure 3:
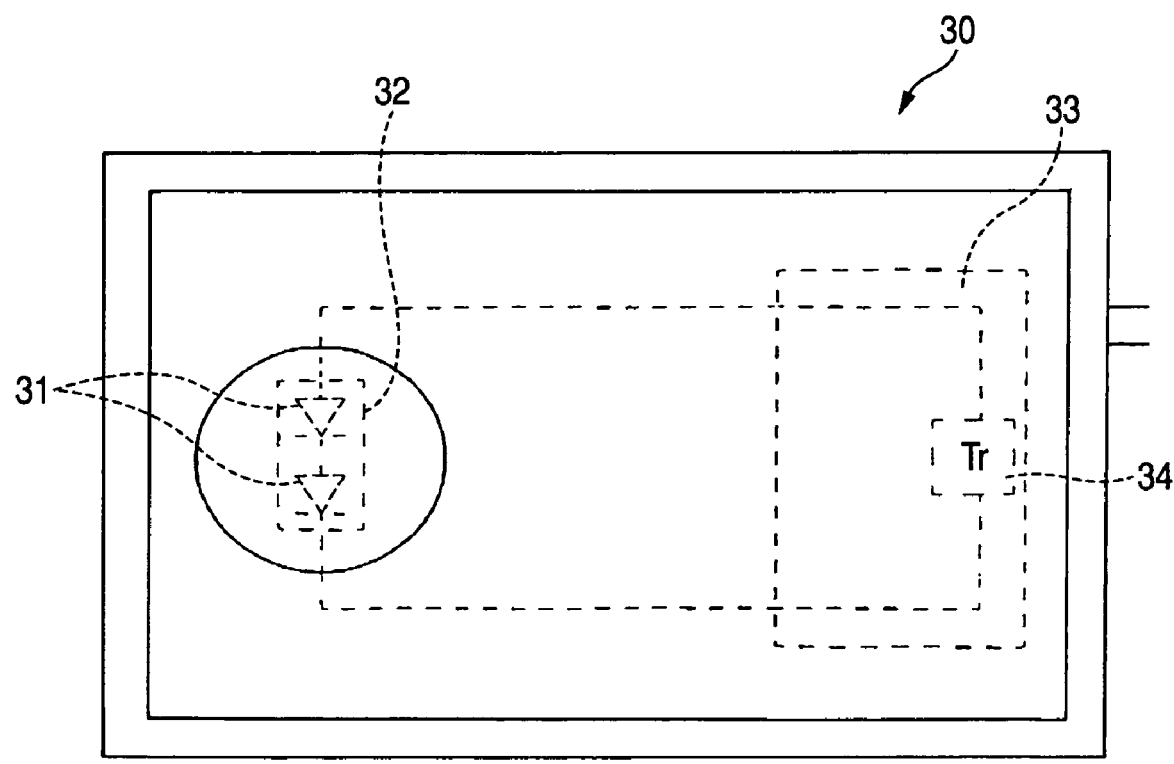
FIG. 3 illustrates arrangement of an LED and a constant current circuit on a substrate of an LED illumination apparatus.

FIG. 3 shows a relation of arrangement of a constant current circuit 33 and an LED device 31. It is possible to give room in arranging devices on a substrate since the number of devices forming the constant current circuit 33 is small. As shown in FIG. 3, a transistor 34 having a heat value larger than heat values of devices forming the constant current circuit 33 is provided one side on the substrate, and the LED device 31 is provided another side on the substrate. That is, the transistor and the LED are provided on edges of the substrate, which are opposed each other, so that a distance therebetween would be largest. This enables heat transmitted from the transistor 34 to the LED device 31 to be efficiently radiated from the radiative substrate and the heat sink. Accordingly, the LED device 31 can be protected from heat from the transistor 34. This results in stable drive and elongation of the life of the LED device 31.

The relation of arrangement of the LED device 31 and the transistor 34 on a substrate is not limited to that of FIG. 3. The two may be provided on corners of a substrate, which are opposed each other.

As described above, in the LED light-emitting apparatus 1, connecting a constant current circuit between an LED and a battery allows a current flowing to the LED to be stabilized even when a battery voltage is varied. That is to say, a flicker in LED light emission due to variation of a battery voltage can be prevented as well as overheat of an LED caused by increase in voltage applied to the LED. Further, providing an LED separately from a device having a large heat value such as a transistor on a substrate allows heat transmission to the LED per se to be prevented. Accordingly, stable drive and elongation of the life of the LED can be achieved.

The above detailed description of the preferred embodiments does not limit the invention at all. A various kinds of modification are included in the invention without deviation from claims and within a range that a person skilled in the art can easily conceive the invention.

What is claimed is:

1. An LED illumination apparatus comprising:
   a radiative substrate;
   at least one LED provided on the radiative substrate; and
   a constant current circuit connected to said at least one LED, said constant current circuit including a transistor provided on one side edge of said radiative substrate,
   wherein said at least one LED is provided on another side of said radiative substrate separated from said transistor by a portion of said radiative substrate devoid of LED light sources and heat generating circuit components,
   wherein the constant current circuit further comprises:
      a Zener diode connected in a reverse direction with respect to a supply voltage;
      a transistor that controls a current flowing to the LED;
      a first resistor that controls an emitter current of the transistor;
      a second resistor that controls a current flowing to the Zener diode; and
      a diode connected in a forward direction to the supply voltage,
   wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

2. The LED illumination apparatus according to claim 1, wherein the transistor and the at least one LED are provided at opposing edges of the substrate.

3. The LED illumination apparatus according to claim 1, wherein the transistor and the at least one LED are provided at opposing corners of the substrate.

4. The LED illumination apparatus according to claim 1, wherein the constant current circuit further comprises:
   a Zener diode connected in a reverse direction with respect to a supply voltage;
   a transistor that controls a current flowing to the LED;
   a first resistor that controls an emitter current of the transistor;
   a second resistor that controls a current flowing to the Zener diode; and
   a diode connected in a forward direction to the supply voltage,
   wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

5. An LED illumination apparatus comprising:
   a radiative substrate;
   at least one LED provided on the radiative substrate; and
   a constant current circuit connected to the at least one LED, said constant current circuit provided on one side of said radiative substrate,
   wherein said at least one LED is provided on another side of said radiative substrate separated from said constant current circuit by a portion of said radiative substrate devoid of LED light sources and heat generating circuit components, and
   wherein the constant current circuit further comprises:
      a Zener diode connected in a reverse direction with respect to a supply voltage;
      a transistor that controls a current flowing to the LED;
      a first resistor that controls an emitter current of the transistor;
      a second resistor that controls a current flowing to the Zener diode; and
      a diode connected in a forward direction to the supply voltage,
      wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

6. The LED illumination apparatus according to claim 5, wherein the heat generating circuit components comprises a transistor.

7. The LED illumination apparatus according to claim 6, wherein the transistor and the at least one LED are provided at opposing edges of the substrate.

8. The LED illumination apparatus according to claim 6, wherein the transistor and the at least one LED are provided at opposing corners of the substrate.

9. The LED illumination apparatus according to claim 5, wherein the at least one LED further comprises:
   at least two LEDs.

10. The LED illumination apparatus according to claim 9, wherein said at least two LEDs are connected in senes.

11. The LED illumination apparatus according to claim 5, wherein the constant current circuit further comprises:
   a Zener diode connected in a reverse direction with respect to a supply voltage;
   a transistor that controls a current flowing to the LED;
   a first resistor that controls an emitter current of the transistor;
   a second resistor that controls a current flowing to the Zener diode; and
   a diode connected in a forward direction to the supply voltage,
   wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

12. The LED illumination apparatus according to claim 5, wherein the radiative substrate comprises at least one of:
   aluminum;
   ceramics;
   copper; and
   iron.

13. The LED illumination apparatus according to claim 5, further comprising a heat sink.

14. The LED illumination apparatus according to claim 13, wherein the heat sink comprises a plurality of radiation fins.

15. The LED illumination apparatus according to claim 13, wherein the heat sink is integrally formed with the radiative substrate.

16. The LED illumination apparatus according to claim 5, wherein said at least one LED is provided on another side edge of said radiative substrate separated by a predetermined distance from said constant current circuit by a substantial portion of said radiative substrate devoid of LED light sources and heat generating circuit components.

17. The LED illumination apparatus according to claim 5, wherein said at least one LED is provided on another side edge of said radiative substrate separated by a predetermined distance from said constant current circuit by a substantial portion of said radiative substrate devoid of LED light sources and heat generating circuit components.

18. An LED illumination apparatus comprising:
an integrally formed radiative substrate and a heat sink;
at least one LED provided on a perimeter of a first side of said integrally formed radiative substrate and said heat sink;
a constant current circuit connected to said at least one LED, said constant current circuit provided on a perimeter of a second opposite side of said integrally formed radiative substrate and said heat sink,
wherein said at least one LED is disposed from said constant current circuit by a portion of said integrally formed radiative substrate and said heat sink devoid of an LED and heat generating circuit components, and
wherein the constant current circuit further comprises:
a Zener diode connected in a reverse direction with respect to a supply voltage;
a transistor that controls a current flowing to the LED;
a first resistor that controls an emitter current of the transistor;
a second resistor that controls a current flowing to the Zener diode; and
a diode connected in a forward direction to the supply voltage,
wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

19. The LED illumination apparatus according to claim 18, said constant current circuit further comprising:
a transistor,
wherein said transistor is disposed on a side of said constant current circuit opposite said at least one LED.

20. The LED illumination apparatus according to claim 18, wherein said heat generating circuit components further comprise:
a transistor.

21. The LED illumination apparatus according to claim 18, wherein the transistor and the at least one LED are provided at opposing corners of the substrate.

22. The LED illumination apparatus according to claim 18, wherein the constant current circuit further comprises:
a Zener diode connected in a reverse direction with respect to a supply voltage;
a transistor that controls a current flowing to the LED;
a first resistor that controls an emitter current of the transistor;
a second resistor that controls a current flowing to the Zener diode; and
a diode connected in a forward direction to the supply voltage,
wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

23. The LED illumination apparatus according to claim 18, wherein said at least one LED is provided on another side edge of said radiative substrate separated by a predetermined distance from said constant current circuit by a substantial portion of said radiative substrate devoid of LED light sources and heat generating circuit components.

24. An LED illumination apparatus comprising:
a radiative substrate;
at least one LED provided on the radiative substrate; and
a constant current circuit connected to the at least one LED, said constant current circuit provided on one side edge of said radiative substrate,
wherein said at least one LED is provided on another side edge of said radiative substrate separated by a predetermined distance from said constant current circuit by a substantial portion of said radiative substrate devoid of LED light sources and heat generating circuit components,
wherein said predetermined distance isolates heat propagated from said constant current circuit in a direction toward said at least one LED, and
wherein the constant current circuit further comprises:
a Zener diode connected in a reverse direction with respect to a supply voltage;
a transistor that controls a current flowing to the LED;
a first resistor that controls an emitter current of the transistor;
a second resistor that controls a current flowing to the Zener diode; and
a diode connected in a forward direction to the supply voltage,
wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

25. An LED illumination apparatus comprising:
a radiative substrate;
at least one LED provided on the radiative substrate; and
a constant current circuit connected to said at least one LED, said constant current circuit including a transistor provided on one side edge of said radiative substrate,
wherein said at least one LED is provided on another side edge of said radiative substrate separated by a predetermined distance from said transistor by a substantial portion of said radiative substrate devoid of LED light sources and heat generating circuit components,
wherein said predetermined distance isolates heat propagated from said constant current circuit in a direction toward said at least one LED, and
wherein the constant current circuit further comprises:
a Zener diode connected in a reverse direction with respect to a supply voltage;
a transistor that controls a current flowing to the LED;
a first resistor that controls an emitter current of the transistor;

a second resistor that controls a current flowing to the Zener diode; and a diode connected in a forward direction to the supply voltage, wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

26. An LED illumination apparatus comprising:

an integrally formed radiative substrate and a heat sink;

at least one LED provided on a perimeter of a first side of said integrally formed radiative substrate and said heat sink;

a constant current circuit connected to said at least one LED, said constant current circuit provided on a perimeter of a second opposite side of said integrally formed radiative substrate and said heat sink, wherein said at least one LED is disposed a predetermined distance from said constant current circuit by a substantial portion of said integrally formed radiative substrate and said heat sink devoid of an LED and heat generating circuit components, wherein said predetermined distance isolates heat propagated from said constant current circuit in a direction toward said at least one LED, wherein the constant current circuit further comprises:

a Zener diode connected in a reverse direction with respect to a supply voltage;

a transistor that controls a current flowing to the LED;

a first resistor that controls an emitter current of the transistor;

a second resistor that controls a current flowing to the Zener diode; and a diode connected in a forward direction to the supply voltage, wherein a collector of the transistor is connected to the LED, an emitter of the transistor is connected to the first resistor, a base of the transistor is connected to the Zener diode as well as the second resistor, the first resistor and the Zener diode are connected to each other and the second resistor is connected to the LED.

* * * * *